US008095817B2

(12) United States Patent
Yamaguchi

(10) Patent No.: US 8,095,817 B2
(45) Date of Patent: Jan. 10, 2012

(54) INFORMATION PROCESSING APPARATUS THAT MAINTAINS SOUND CONTROLLER IN POWER SAVING MODE WHEN SPEAKER IS SET IN VOLUME FULL-MUTE STATE

(75) Inventor: Makoto Yamaguchi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 601 days.

(21) Appl. No.: 12/116,882

(22) Filed: May 7, 2008

(65) Prior Publication Data

US 2008/0282099 A1    Nov. 13, 2008

(30) Foreign Application Priority Data

May 7, 2007    (JP) .................................. 2007-122430

(51) Int. Cl.
*G06F 1/32* (2006.01)
(52) U.S. Cl. ........................................ 713/324; 455/574
(58) Field of Classification Search .................. 713/320, 713/324; 455/574
See application file for complete search history.

(56) References Cited

U.S. PATENT DOCUMENTS

| 6,119,239 A |  | 9/2000 | Fujii |  |
|---|---|---|---|---|
| 6,128,263 A |  | 10/2000 | Fujii |  |
| 6,282,667 B1 | * | 8/2001 | Nakazato | 713/324 |
| 7,698,584 B2 | * | 4/2010 | Dunstan et al. | 713/300 |
| 7,707,447 B2 | * | 4/2010 | Kim | 713/324 |
| 2010/0248794 A1 | * | 9/2010 | Huang et al. | 455/572 |

FOREIGN PATENT DOCUMENTS

| JP | H07-239737 | 9/1995 |
|---|---|---|
| JP | H10-124201 | 5/1998 |
| JP | 11-73256 | 3/1999 |
| JP | H11-073256 | 3/1999 |
| JP | H11-086433 | 3/1999 |

OTHER PUBLICATIONS

Notice of Reasons for Rejection mailed by the Japan Patent Office on May 17, 2011 in the corresponding Japanese patent application No. 2007-122430 in 4 pages.

* cited by examiner

*Primary Examiner* — Albert Wang
(74) *Attorney, Agent, or Firm* — Knobbe Martens Olson & Bear, LLP

(57) ABSTRACT

According to one embodiment, an information processing apparatus includes a sound controller which reproduces a sound signal, and a sound driver which controls a drive of the sound controller. The sound driver includes a volume full-mute determination unit which determines whether or not the apparatus is set in a volume full-mute state of making zero sound output volume, and a control unit which determines whether or not the apparatus is set in a volume full-mute state by using the volume full-mute determination unit when a sound signal reproduce request is made while the sound controller has transferred to a power saving mode, and maintains the sound controller in a power saving mode when the apparatus is set in a volume full-mute state.

8 Claims, 4 Drawing Sheets

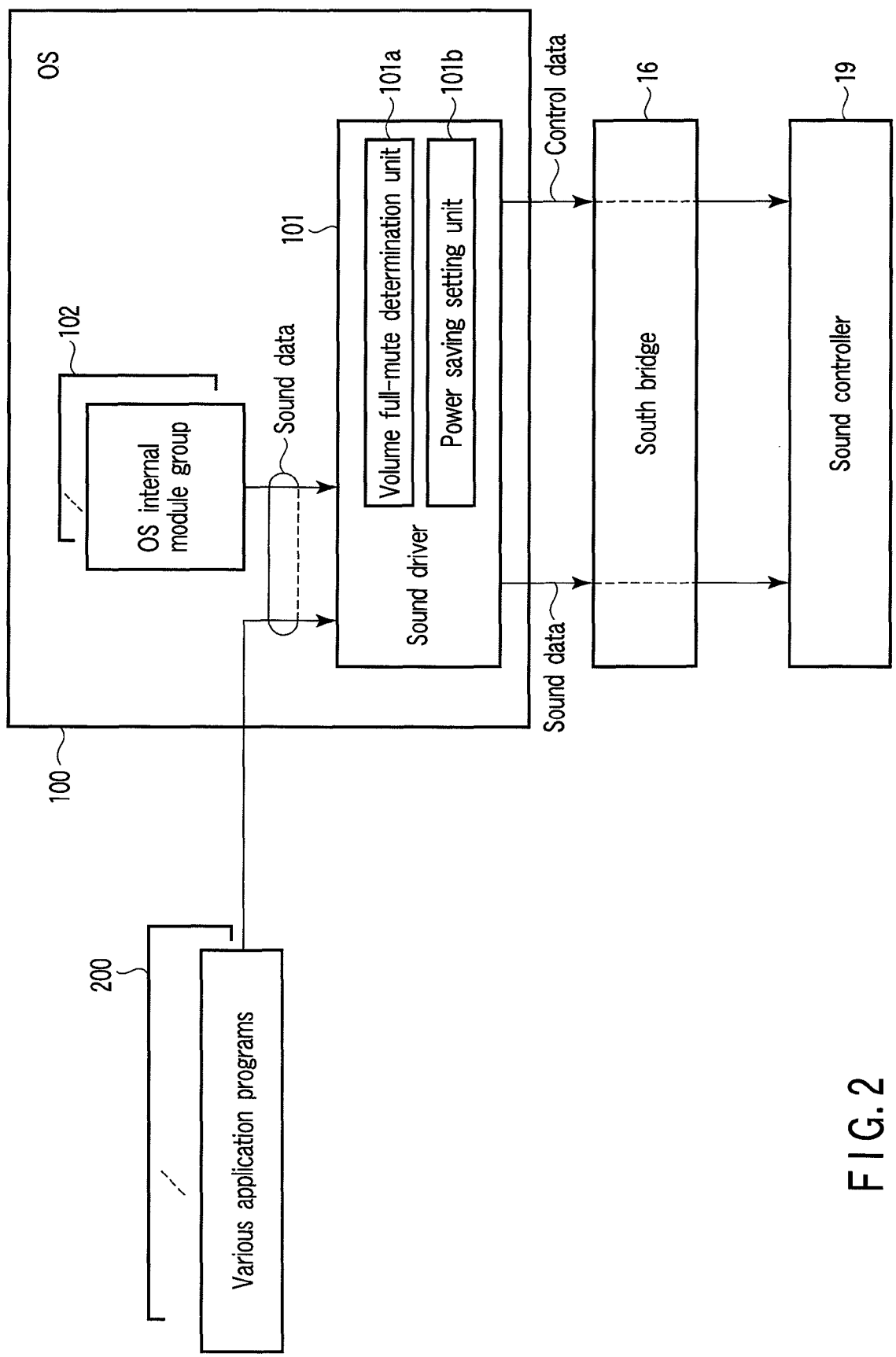
F I G. 2

INFORMATION PROCESSING APPARATUS THAT MAINTAINS SOUND CONTROLLER IN POWER SAVING MODE WHEN SPEAKER IS SET IN VOLUME FULL-MUTE STATE

CROSS-REFERENCE TO RELATED APPLICATIONS

This application is based upon and claims the benefit of priority from Japanese Patent Application No. 2007-122430, filed May 7, 2007, the entire contents of which are incorporated herein by reference.

BACKGROUND

1. Field

One embodiment of the invention relates to a power saving control technique preferably applied to an information processing apparatus, such as a battery-powered portable type personal computer.

2. Description of the Related Art

In recent years, battery-powered and readily portable information processing apparatuses, such as notebook type personal computers or PDAs (Personal digital assistants) have come into wide use. Further, the wireless communication environment is well-serviced as a social infrastructure. Users with this kind of information processing apparatus can thereby work outdoors or on the move and keep up to date with the most recent data, and exchange data.

In this kind of information processing apparatus, various proposals to realize power saving have been made so far in order to secure continuous battery-powered time for as long as possible (e.g., see Jpa. Pat. Appln. KOKAI Publication No. 11-73256). The foregoing Publication No. 11-73256 discloses the information processing apparatus including the following technique. According to the technique, when all peripheral devices (having a sound signal output function) connected to a sound controller enter a mute state, the sound controller is transferred to a power saving mode. In this way, the information processing apparatus realizes power saving.

This kind of information processing apparatus has a possibility of being used in various situations, that is, during movement and outdoors. Of users having this kind of information processing apparatus, some users set the information processing apparatus to sound output volume zero, a so-called volume full-mute state in view of consideration of the environment. In this case, even if a peripheral device returns from a mute state, and a sound controller reproduces a sound signal output from such peripheral device, the reproduced sound is not output. Namely, in such a case, preferably, the sound controller is also maintained in a power saving mode in view of power saving.

The foregoing circumstances are not limited to the sound output from a peripheral device. For example, the same circumstances as the sound output from the peripheral devices are present in an operating sound and warning sound output from an operating system in response to a user's operation. Therefore, it is desired to provide some measures to achieve power saving.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary view to explain a basic concept of an internal module group of an OS operating on the computer of the embodiment and sound outputs by various application programs operating under the control by the OS;

DETAILED DESCRIPTION

Various embodiments according to the invention will be described hereinafter with reference to the accompanying drawings. In general, according to one embodiment of the invention, an information processing apparatus includes a sound controller which reproduces a sound signal, and a sound driver which controls a drive of the sound controller. The sound driver includes a volume full-mute determination unit which determines whether or not the apparatus is set in a volume full-mute state of making zero sound output volume, and a control unit which determines whether or not the apparatus is set in a volume full-mute state by using the volume full-mute determination unit when a sound signal reproduce request is made while the sound controller has transferred to a power saving mode, and maintains the sound controller in a power saving mode when the apparatus is set in a volume full-mute state.

Figure 1:
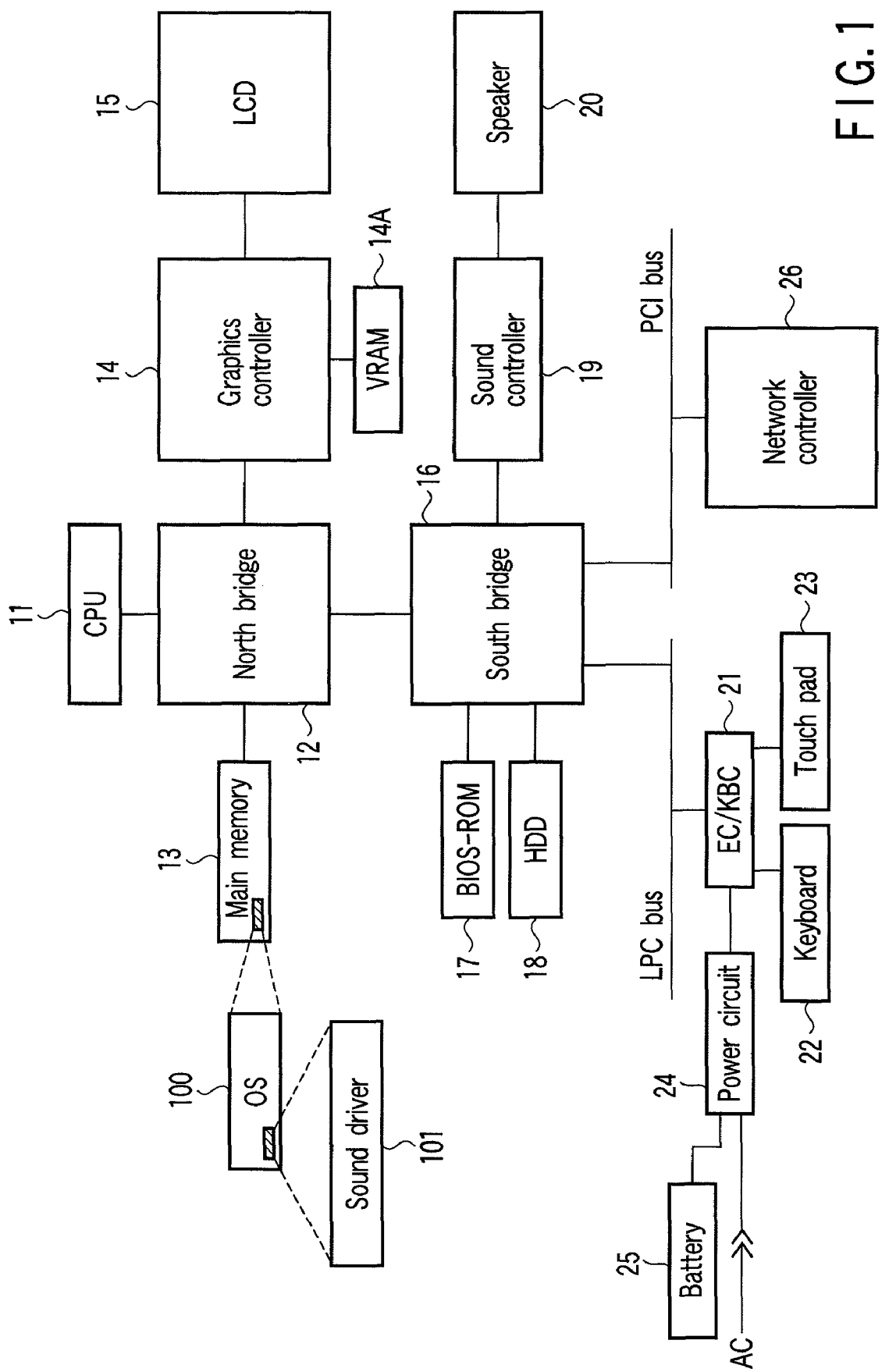
FIG. 1 is an exemplary block diagram showing the configuration of an information processing apparatus (personal computer) according to one embodiment of the invention.

FIG. 1 is an exemplary block diagram showing the configuration of an information processing apparatus according to this embodiment. The information processing apparatus is realized as a batter-powered notebook type personal computer.

As shown in FIG. 1, the computer includes CPU 11, north bridge 12, main memory 13, graphics controller 14, VRAM 14A, LCD 15, south bridge 16, BIOS-ROM 17, and HDD 18. The computer further includes sound controller 19, speaker 20, embedded controller/keyboard controller (EC/KCB) 21, keyboard 22, touch pad 23, power circuit 24, battery 25 and network controller 26.

The CPU 11 is a processor that controls the operation of various devices included in the computer. The CPU 11 executes an operating system (OS) 100 loaded from the HDD 18 to the main memory 13 and various application programs, including utility, operating under the control of the OS 100. The OS 100 includes a sound driver 101. The sound driver outputs a sound via the sound controller 19, which uses the OS 100 and various application programs as hardware. The CPU 11 further executes a BIOS stored in the BIOS-ROM 17. The BIOS is a program for controlling various hardware.

The north bridge 12 is a bridge device, which makes a connection between a local bus of the CPU 11 and the south bridge 16. The north bridge 12 has a function of executing communications with the graphics controller 14 via a bus. The north bridge 12 further has a built-in memory controller for controlling access to the main memory 13. The graphics controller 14 is a display controller, which controls the LCD 15 used as a display monitor of the computer. The graphics controller 14 generates a display signal to be sent to the LCD 15 from image data written to the VRAM 14A.

The south bridge 16 is a controller, which controls various devices on a PCI bus and an LPC bus. The south bridge 16 is directly connected with the BIOS-ROM 17, the HDD 18 and the sound controller 19, and further, has a function of controlling these devices. The sound controller 19 is a sound source controller, which reproduces a sound signal supplied via the south bridge 16, and outputs the sound signal from the speaker 20.

The EC/KBC 21 is a one-chip microcomputer, which is integrated with an embedded controller and a keyboard controller. The embedded controller is used for power management. The keyboard controller is used for controlling the keyboard 22 and the touch pad 23. The EC/KBC 21 controls the supply of power from the battery or external AC power supply to various devices in cooperation with the power circuit 24. The network controller 26 is a communication device, which makes communications with an external network such as the Internet.

A sound output basic principle will be described with reference to FIG. 2. The sound output is given by an internal module group 102 in the OS 100 operating on the computer having the foregoing hardware configuration and by various application programs 200 operating under the control of the OS 100.

For example, if any application program 200 operating under the control of the OS 100 outputs a sound, the program 200 transfers a sound signal (sound data) of the sound to a sound driver 101 of the OS 100. For example, the OS internal module group 102 outputs an operating sound when a click button on a mouse is pressed, and outputs a warning (alert) sound. In another case, the OS internal module group 102 transfers a sound signal (sound data) such as an operating sound or warning sound to the sound driver 101.

The sound driver receiving the sound signal basically supplies the received sound signal to the sound controller 19 via the south bridge 16. In this way, the sound signal is reproduced by the sound controller 19, and then, output from the speaker 20. The computer has a power saving function. According to the power saving function, if sound output stops for a predetermined time, the sound controller 19 is transferred to a power saving mode. When the sound controller 19 has transferred to the power saving mode, the sound driver 101 receives sound signals from various application programs 200 and the OS internal module 102. In this case, the sound driver 101 supplies a control signal (control data) for returning the sound controller 19 from the power saving mode to the sound controller 19 via the south bridge 16. Thereafter, the sound driver 101 supplies the received sound signal to the sound controller 19 via the south bridge 16. Thus, the sound driver 101 includes a power saving mode setting unit 101b for transferring the sound controller 19 to the power saving mode and the reverse operation.

The sound driver 101 further includes a volume full-mute determination unit 101a. The volume full-mute determination unit 101a determines whether or not the computer is set to a sound output volume zero state, that is, a so-called volume full-mute state. First, the sound driver 101 makes a detection that the computer is set to the volume full-mute state by the volume full-mute determination unit 101a. Then, the power saving mode setting unit 101b instantaneously transfers the sound controller 19 to the power saving mode (without waiting for the stoppage of sound output for a predetermined time). Thereafter, the sound driver 101 determines the following operation when the sound controller 101 is transferring to the power saving mode. Specifically, the sound driver 101 determines whether or not the computer is set to the volume full-mute state by the volume full-mute determination unit 101a when receiving sound signals from various application programs 200 and the OS internal module group 102. If the computer is set to the volume full-mute state, the sound driver 101 keeps the sound controller 19 in the power saving mode without returning the sound controller 19 from the power saving mode.

In the OS 100, there exists the OS internal module group 102, which outputs various operating sounds and warning sounds in response to various operations of a user. Thus, according to the conventional case, even if the sound controller 19 is transferred to the power saving mode under predetermined conditions, it is returned from the power saving mode every time the foregoing sounds are output. As a result, the sufficient effect is not substantially obtained. Moreover, even if the computer is set in the volume full-mute state, sound is not output, but actually, the sound controller 19 is activated in the computer.

On the contrary, when the computer of this embodiment is set in the volume full-mute state, the sound controller 19 is instantaneously transferred to the power saving mode, and the power saving mode is maintained. Therefore, a sufficient effect is obtained.

Figure 3:
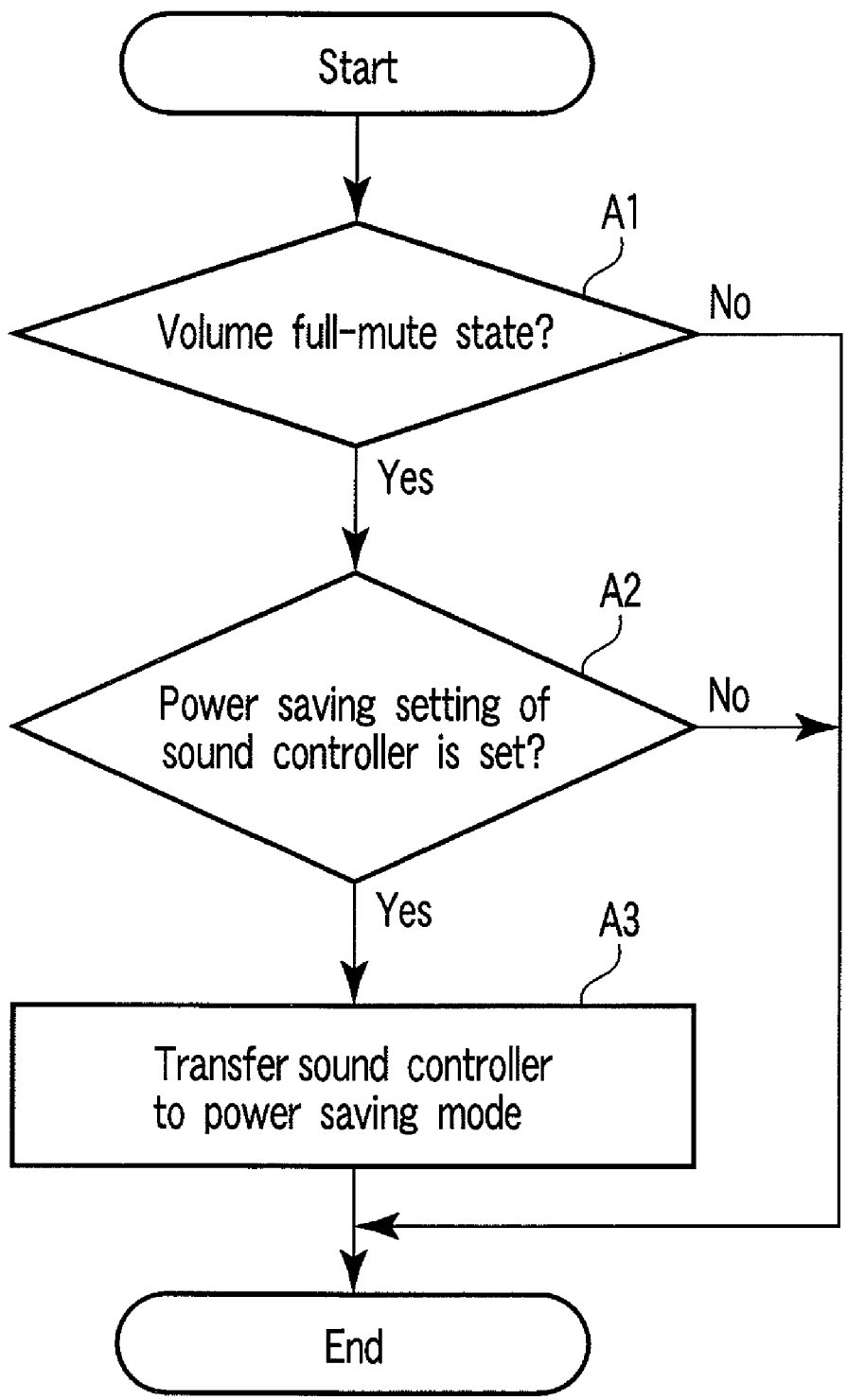
FIG. 3 is an exemplary first flowchart to explain an operation procedure of power saving control executed by a sound driver operating on the computer of the embodiment.
Figure 4:
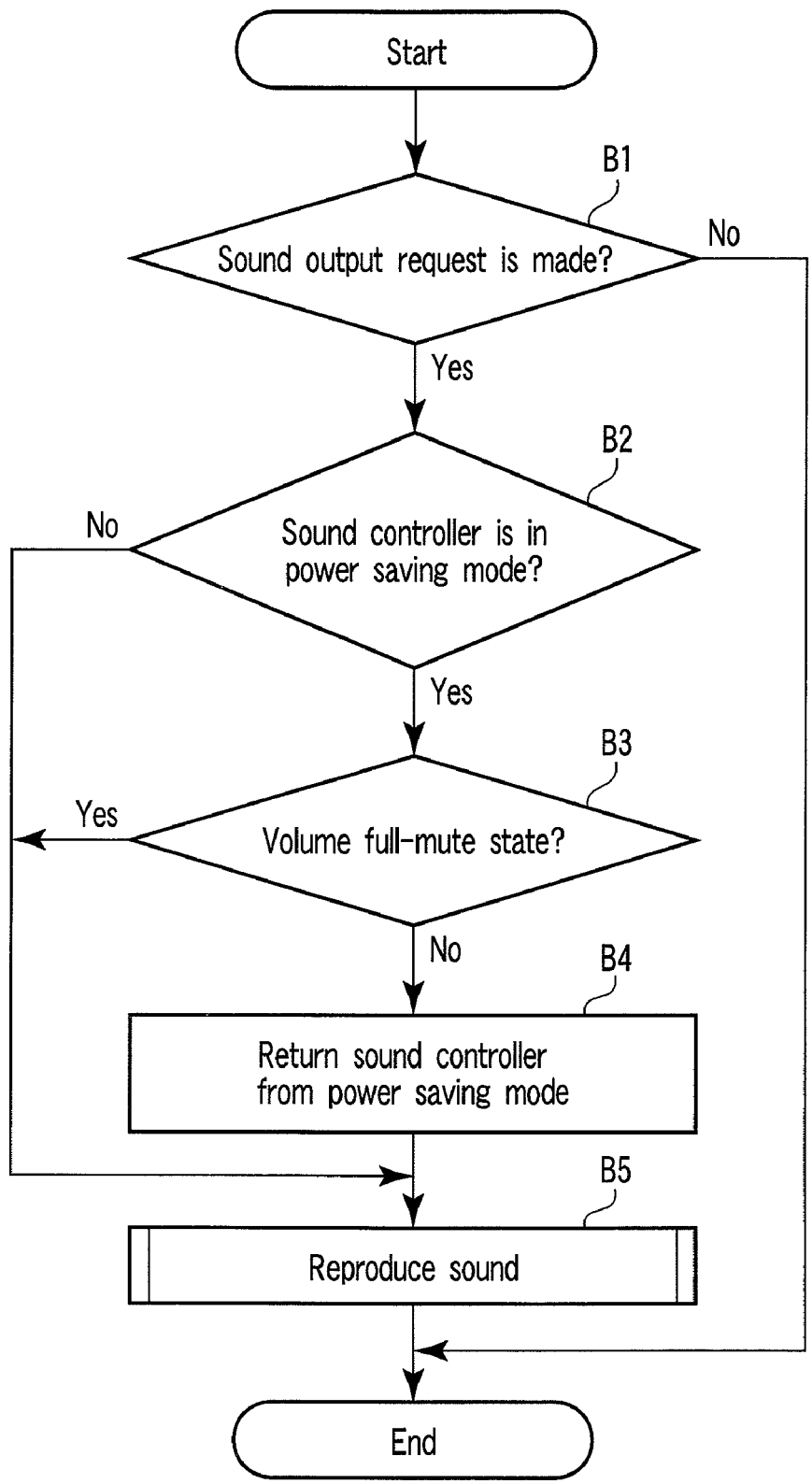
FIG. 4 is an exemplary second flowchart to explain an operation procedure of power saving control executed by a sound driver operating on the computer of the embodiment.

FIG. 3 and FIG. 4 are exemplary flowcharts to explain an operation procedure of the power saving control executed by the sound driver 101 of the embodiment.

When detecting the volume full-mute state (YES in block A1 of FIG. 3), the sound driver 101 determines whether or not power saving setting of the sound controller 19 is valid (Block A2 of FIG. 3). If the foregoing power saving setting of the sound controller 19 is valid (YES in block A2 of FIG. 3), the sound driver 101 instantaneously transfers the sound controller 19 to the power saving mode (block A3 of FIG. 3).

When receiving a sound output request (YES in block B1 of FIG. 4), the sound driver 101 determines whether or not the sound controller 19 is transferring to the power saving mode (block B2 of FIG. 4). If the sound controller 19 is transferring to the power saving mode (YES in block B2 of FIG. 4), the sound driver 101 determines whether or not the computer is set in the volume full-mute state (block B3 of FIG. 4). If the computer is not set to the volume full-mute state (NO in block B3 of FIG. 4), the sound driver 101 returns the sound controller 19 from the power saving mode (block B4 of FIG. 4). In other words, if the computer is set to the volume full-mute state (YES in block B3 of FIG. 4), the sound driver 101 outputs sound; nevertheless, intactly maintains the sound controller 19 in the power saving mode.

Thereafter, the sound driver 101 supplies the received sound signal to the sound controller 19 via the south bridge 16 so that the sound controller 19 reproduces sound (block B5 of FIG. 4). If the sound controller 19 is transferring to the power saving mode and the computer is set to the volume full-mute state, the sound controller 19 is not operated.

As described above, the computer of this embodiment properly realizes power saving control in the volume full-mute state.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing apparatus, comprising:
a sound controller configured to reproduce a sound signal and to output the sound signal to a speaker;
a determination unit configured to determine whether or not a volume of the speaker is set in a volume full-mute state; and
a control unit configured to maintain the sound controller in a power saving mode if the determination unit determines that the volume of the speaker is set in the volume full-mute state, when a sound signal reproduce request is made while the sound controller is in the power saving mode.

2. The apparatus of claim 1, further comprising a power saving mode setting unit configured to transfer the sound controller from a normal operation mode to the power saving mode when the determination unit determines that the volume of the speaker is set in the volume full-mute state.

3. The apparatus of claim 2, wherein the power saving mode setting unit is configured to transfer the sound controller from a normal operation mode to the power saving mode when the output of the sound signal is stopped for a predetermined time.

4. The apparatus of claim 1, wherein the control unit is configured to return the sound controller from the power saving mode to a normal operation mode when the volume of the speaker is switched out of the volume full-mute state.

5. A method of saving power for an information processing apparatus comprising a sound controller configured to reproduce a sound signal, the method comprising:
determining whether or not a volume of the speaker is set in a volume full-mute state when a sound signal reproduce request is made while the sound controller is in a power saving mode; and
maintaining the sound controller in the power saving mode when the volume of the speaker is determined to be in the volume full-mute state.

6. The method of claim 5, further comprising transferring the sound controller from a normal operation mode to the power saving mode when the volume of the speaker is in a volume full-mute state.

7. The method of claim 5, further comprising transferring the sound controller from a normal operation mode to the power saving mode when the output of the sound signal is stopped for a predetermined time.

8. The method of claim 5, further comprising returning the sound controller from the power saving mode to a normal operation mode when the volume of the speaker is switched out of the volume full-mute state.

* * * * *